United States Patent [19]

Miyazawa et al.

[11] Patent Number: 5,769,991
[45] Date of Patent: Jun. 23, 1998

[54] METHOD AND APPARATUS FOR WAFER BONDING

[75] Inventors: Yoshihiro Miyazawa; Yasunori Ohkubo, both of Kanagawa, Japan

[73] Assignee: Sony Corporation, Japan

[21] Appl. No.: 200,432

[22] Filed: Feb. 23, 1994

[30] Foreign Application Priority Data

Feb. 28, 1993 [JP] Japan .................................. 5-062980

[51] Int. Cl.⁶ ............................................ H01L 21/304
[52] U.S. Cl. .................................. 156/153; 148/DIG. 12; 148/DIG. 135; 148/DIG. 159; 156/281; 437/225; 437/974
[58] Field of Search ................................... 156/281, 153, 156/154; 148/DIG. 12, DIG. 159, DIG. 135; 437/225, 901, 974

[56] References Cited

U.S. PATENT DOCUMENTS

| | | | |
|---|---|---|---|
| 4,883,215 | 11/1989 | Goesele et al. | 156/281 X |
| 5,129,827 | 7/1992 | Hoshi et al. | 148/DIG. 12 X |
| 5,131,968 | 7/1992 | Wells et al. | 156/153 |
| 5,169,472 | 12/1992 | Goebel | 156/153 X |

OTHER PUBLICATIONS

Black, R.D., et al "Silicon and silicon dioxide thermal bonding for silicon–on–insulator applications," Journal of Applied Physics, 63 (8), 15 Apr. 1988, pp. 2773–2777.

Lasky, J.B., "Wafer bonding for silicon–on–insulator technologies", Applied Physics Letters, 48 (1), 6 Jan. 1986, pp. 78–80.

Ohashi, H., et al "Study of Si–Wafer Directly Bonded Interface Effect on Power Device Characteristics," IEEE, 1987, pp. 678–680.

Abe, T. et al "Silicon Wafer–Bonding Process Technology for SOI Structures," Proceedings of 4th International Symposium on Silicon–on–Insulator Technology and Devices, May 6–11, 1990, Montreal.

Shimbo, M. et al, "Silicon–to–silicon direct bonding method," Journal of Applied Physics, 60(8), 15 Oct. 1986, pp. 2987–2989.

Haisma, Jan, et al, "Silicon–on –Insulator Wafer Bonding—Wafer Thinning Technological Evaluations," Japanese Journal of Applied Physics, vol. 28, No. 8, Aug. 1989, pp. 1426–1443.

*Primary Examiner*—Jeff H. Aftergut
*Attorney, Agent, or Firm*—Ronald P. Kananen

[57] ABSTRACT

A method of wafer bonding with less elongation and contraction of wafers at the time of and after the bonding of the wafers is disclosed. In the method of wafer bonding, wafers are bonded together with sticking force of their surfaces to form a bonded wafer. The bonding is done by selecting the pressure of the gas between the wafers to be lower than the atmospheric pressure, for instance, and also selecting the kind of gas between the wafers to $H_2$, for instance.

20 Claims, 10 Drawing Sheets

FIG. 7
(PRIOR ART)

| WAFER WITH PATTERNS | WAFER TO BE POLISHED | EXPANSION OR CONTRACTION OF A PATTERN |
|---|---|---|
| A | A | CONTRACT |
| A | B | ——— |
| B | A | ——— |
| B | B | EXPAND |

(——— NO EXPANSION OR CONTRACTION EXPANSION)

METHOD AND APPARATUS FOR WAFER BONDING

BACKGROUND OF THE INVENTION

1. Field of the Invention

This invention relates to a method of wafer bonding. The invention is generally applicable to the formation of a bonded wafer by bonding together two wafer. For example, the invention is applicable to the formation of a semiconductor bonded wafer by bonding together two semiconductor wafers. As one of means for forming a SOI (silicon on insulator) structure used as the structure of a semiconductor device or like electronic part (which is an art of forming various semiconductor elements on silicon portions provided on an insulator portion and utilized mainly in the field of electronic materials), there is known a technique for producing a structure in which silicon is present on an insulator, by bonding a wafer to an insulator side of a separate silicon wafer an insulator provided and polishing the silicon wafer side. This structure is generally called a bonded SOI. The invention is applicable to the formation of such bonded SOI. (For the bonding technique, see, for instance, Nikkei Mcgrowhill Inc., "MIKKEI MICRODEVICES", March 1998, page 82.)

2. Description of the Related Art

Among the methods of producing SOI wafers, there are a wafer bonding method, in which two wafers are bonded together via an insulator layer, a SIMOX method, in which an insulating oxide layer is formed in a substrate by ion implanting oxygen and then annealing, and a fusing recrystallization method, in which polysilicon or amorphous silicon on an insulator layer is used into single crystals.

Of these methods, the wafer bonding method permits large area and high quality crystals to be obtained, and recently extensive researches and developments have been made in connection with this method. In the wafer bonding method, with a 5-inch diameter wafer, for instance, two wafers each about 600 microns in thickness are bonded together via an insulator layer, and then one of the wafers is made thinner to a thickness of several microns or below (for instance 0.1 micron), thus obtaining a SOI wafer.

In one well-known wafer bonding method, the wafer surfaces are treated with a reagent such as a liquid containing hydrogen peroxide and sulfuric acid to form OH groups on the surfaces, and mutual sticking forces of these OH groups are utilized to effect the bonding. In this process, it is important that no void is formed in the interface of the bonding. Problems in such related art formation of the bonded SOI structure will now be discussed with reference to FIGS. 1A to 1D and FIGS. 2A to 2C. One principle surface of a silicon wafer 21 (generally a high flatness silicon wafer, referred to as wafer A) as shown in FIG. 1A is patterned with the photographic or etching technology. Then, an insulator 22 is formed on the patterned surface by forming a $SO_2$ layer or the like. A structure as shown in FIG. 1B is thus formed, in which the insulator 22 is formed on one surface of the silicon wafer 21. The insulator 22 is formed as an uneven surface layer as shown in correspondence to the patterned surface shape of the silicon wafer 21. Then, on the insulator 22 in the structure of FIG. 1B, a polysilicon layer is formed as a bonding layer 23, as shown in FIG. 1C. The bonding layer 23 (i.e., polysilicon layer) is to form a highly flat bonding surface for bonding a separate wafer (i.e., wafer 24 shown in FIG. 2A) thereto in a subsequent step.

Subsequently, the surface of the bonding layer as polysilicon layer is flattened by polishing into a highly flat surface (FIG. 1D).

A separate wafer 24 (referred to as wafer B) is then pressed against the polished surface of the bonding layer 23. With this pressing, the two surfaces are bonded together to obtain a bonded structure as shown in FIG. 2A. Generally, it is said that firm bonding is attainable with hydrogen bonds formed by the action of water or hydroxyl groups present on the two surfaces. This system is usually heated to obtain thermal bonding, thus attaining very firm bonding. The bonding strength is usually 200 $kg/cm^2$ or above, and in some cases it is as high as 2,000 $kg/cm^2$. The separate wafer 24 (i.e., wafer B) to be bonded is usually a silicon wafer like the wafer 21 (i.e., wafer A). This is so because in many cases the bonded workpiece is subjected to a heat treatment; thus it may be inconvenient unless the two wafers are the same in thermal expansion coefficient or like physical properties. If this problem is not present, in the prior art shown in FIGS. 1A to 1D and 2A to 2C, the separate wafer 24 only serves the role of a support, and thus it need not be a silicon wafer. Where an element is to be formed on the separate wafer 24 (i.e., wafer B) as well, however, this wafer should be a semiconductor wafer capable of element formation thereon.

In subsequent step, the edge is chamfered. Then, the surface of the wafer 21 is ground to obtain a structure as shown in FIG. 2B. This surface grinding is stopped before the insulator 22 is exposed.

In FIGS. 2B and 2A, the wafer is shown in reversed states. This is so in that the wafer 21 is brought to the top for chamfering or grinding.

In a subsequent step, selective grinding is done. In this step, precise finish grinding is done until the insulator 22 is just exposed. As a result, a structure as shown in FIG. 2C is obtained, in which silicon portions 20 are present on and surrounded by uneven insulator 22. In this structure with the silicon portions 20 present on the insulator 22 (SOI structure), elements are formed on the silicon portions 20. In the structure shown in FIG. 2C, in which the individual silicon portions 20 are surrounded by the insulator 22, the element isolation is provided from the outset.

In FIG. 2C, one silicon portion 20 is shown to an enlarged scale for the sake of clarity of illustration. Actually, however, a large number of fine silicon portions 20 are gathered.

In the formation of the above bonded SOI structure, it is liable that voids are formed in the interface of bonding. Specifically, when bonding together the surface of the silicon layer 23 on the wafer 21 and the wafer 24 as shown in FIG. 2A, voids are liable to be formed in the interface. When the bonding surfaces of both the wafers are both flat, they are liable to be brought into contact with each other at a large number of points, and therefore, voids are liable to be formed with introduction of air. The voids that may be produced may be 3.5 to 5 mm in size.

Where voids are produced, the contact surfaces are not in close contact, the two surfaces are not sufficiently bonded and are thus liable to be separated. For example, after the surface polishing in FIG. 2B, the layer on the wafer 21 on the side of the the wafer 24 is as thin as 4 to 20 microns, usually 5 to 10 microns, and thus the wafers will be readily separated if voids are present. This will become a contaminant and gravely influences the element formation. For example, scratches will be generated on the wafer. In this way, the separation due to voids causes contamination to spoil the reliability of elements. In the state of FIG. 2C, the layer on the wafer 24 on the side of the silicon 20 is even thinner, i.e., as thin as 3 to 4 microns. In this case, separation that may result will again cause contamination and leads to defective elements.

For the above reasons, it is necessary to prevent generation of voids in the interface of the bonding of the two wafers.

Heretofore, to avoid generation of voids between the two bonded wafers in the formation of the bonded SOI, a technique as shown in FIGS. 3A to 3C has been adopted. In this technique, a first and a second support 43 and 44 are used to support a wafer 34 and the other wafer 31, for instance a semiconductor wafer, respectively. The second support 44 supports the wafer 31 such that the surface thereof is convex with respect to the wafer 34. In this state, the bonding is made. (The figure shows the convex state exaggeratedly for the sake of the clarity).

In this technique, however, since the bonding is effected with the wafer 31 held in a warped state, the pattern is subject to elongation and contraction, although slightly. If the bonding surfaces are convex, in the wafer with a device pattern formed thereon, the elongation of the pattern corresponding to the radius of curvature of the convex shape remains as the two wafers are bonded together. This leads to a failure of pattern pitch matching in the next exposure process, thus resulting in a pattern deviation defect. It may be thought to construct the second support 44 for supporting the wafer 31 as a vacuum chuck. Even by so doing, however, it can not be ensured that the wafer 31 can be supported in a satisfactory convex state at all times. Further, when forming a flat bonded wafer by bonding, that is, when bonding is done from the state shown in FIG. 3B to the state shown in FIG. 3C, a satisfactory close contact bonding can not be obtained, thus resulting in elongation or contraction of the pattern. Therefore, with the bonding technique, in which either one of the two wafers is supported in a convex state as noted above, it is difficult to meet the current demands of the advanced art of producing finer patterns.

FIGS. 4A to 4D show a technique proposed in Japanese Patent Application No. H4-160266 with an aim of solving the above problems and permitting the prevention of the void generation for bonding in a satisfactory state and attainment of the bonding of wafers without such inconvenience as the elongation and contraction of the pattern. In this technique, when bonding together two wafers 51 and 54 to produce a bonded wafer, the two wafers 51 and 54 are held close to each other such as to provide a substantially uniform slight gap between them (FIG. 4B). Then, one point of either one of the wafers 51 and 54 is pushed against the other wafer (FIG. 4C). Thus, bonding due to mutual sticking forces of the two wafers is caused to proceed from the pushed point noted above, thus effecting the bonding of the two wafers 51 and 54.

The two wafers 51 and 54 may be held with a substantially uniform slight gap between them by various means. For example, the wafer 51 is caused to approach the other wafer 54 in the gravitational direction so that it becomes stationary such that the two wafers are spaced apart slightly due to air present between them. In another example, resort is had to electrostatic forces for repulsion between the two wafers 51 and 54.

In FIGS. 4A to 4D, designated at 66 is gas exhausting, at 61 a ventilating member, and at 62 a support surrounding and supporting the ventilating member 61.

In the above technique, as shown in FIGS. 5A and 5B, a wafer 74, as one of wafers A and 71 with OH groups formed thereon by a surface treatment, is held by vacuum suction for instance, on a flat wafer chuck 76, and the other wafer 71 is overlapped over the wafer 74. In this stage, the bonding is not started due to the presence of gas (i.e., air or like gas of atmosphere) in the interface. Accordingly, a pressure is applied partially as shown in FIG. 5B, whereby the bonding is started with the mutual sticking forces of the OH groups. The bonding is caused to proceed while purging gas from the interface. Thus, bonding free from voids is obtainable.

However, according to the above method, the wafer B (i.e., wafer 71) sticks, and a warp is produced due to a difference between portions, in which the gas in the interface is purged, and portions, in which gas remains, as shown in FIG. 6. The extent of warp is determined by the balance between the force of restoring the warp by the elasticity of the wafers and the resistance offered to the purging.

Here the following problems are posed.

(1) With the warp the underside of the wafer B (i.e. wafer 71) is bonded to the wafer A (i.e., wafer 74) in an elongated state, and a stress is produced in the interface.

(2) Where a pattern is formed in a advance in wafer, it is elongated or contracted. As for the final wafer size, it is thought that of the wafers A and B, the one which is not made thinner is restored to the initial size, and the elongation or contraction of the pattern is thought to appear as in FIG. 6.

The elongation and contraction of pattern pose problems in connection with the lap accuracy in a photo-lithographic process, that is, the accuracy, with which a mask pattern is applied after bonding to a pattern which has been formed before bonding. At present, the maximum permissible error in the production level is ⅓ to ¼ of the minimum pattern line width. For example, in a process of a rule with C of 25 microns, it is about 0.06 microns. Assuming a square chip with one side of 20 mm, it corresponds to 3 ppm. In 3 ppm, the deviations in the photo-resist process and fluctuations in machining are contained, and thus the elongation and contraction of pattern after the bonding has to be sufficiently smaller than 3 ppm.

(3) FIG. 8 shows an example, in which an oxide layer is formed on a wafer. As is seen, the wafers before the bonding has already undergone an elongation or contraction of several ppm in the process. If the elongation or contraction of wafer can be made up for and reduced in the bonding process, the degree of freedom of the process before the bonding will be increased.

OBJECTS AND SUMMARY OF THE INVENTION

The present invention has been attained in the light of the above problems inherent in the related art, and it seeks to provide a method of wafer bonding, in which the elongation and contraction of wafer at the time of and after the bonding of wafers can be reduced.

According to the invention, a method of wafer bonding for attaining the above object is provided for creating a bonded wafer by bonding; and together wafers with sticking forces of the surfaces of the wafers, wherein the bonding is done by selecting the pressure or kind of gas between the wafers.

According to the invention, there is provided, for attaining the above object, a method of wafer bonding for forming a bonded wafer by bonding together wafers with sticking forces of the surfaces of the wafers, wherein the pressure of gas between the wafers is lower than the atmospheric pressure.

In another aspect of the invention, there is provided, for attaining the above object, a method of wafer bonding, wherein the pressure of gas between the wafers is 0.2 to 0.5 atm., preferably 0.3 atm., before the start of the sticking of the surfaces.

According to another aspect of the invention, there is provided, for attaining the above object, a method of wafer bonding for forming a bonded wafer by bonding together wafers with sticking forces of the surfaces of the wafers, wherein the space between the wafers before the start of the sticking of the surfaces is filled with a gas having a lower viscosity than that of air, for instance $H_2$ gas.

In another feature of the invention, there is provided, for attaining the above object, a method of wafer bonding, wherein the pressure of gas between said wafers before the start of sticking of the surfaces os lower than the atmospheric pressure.

According to still another feature of the invention, the elongation and contraction of wafer can be reduced by controlling the extent of warp of the bonded wafers through control of the pressure or kind of gas between the wafers. In addition, with a wafer which has been greatly elongated or contracted, the elongation or contraction after the bonding can be reduced by providing a reverse deformation. That contraction of wafer after the bonding can be reduced without spoiling the features of the bonding method subject to less void generation by changing the pressure and kind of ambient gas between the wafers.

BRIEF DESCRIPTION OF THE DRAWINGS

FIG. 7 is a view for explaining problems inherent in the related art;

DETAILED DESCRIPTION OF THE PREFERRED EMBODIMENT

A specific embodiment of the invention will now be described with reference to the drawings. It is of course to be construed that the embodiment is by no means limitative.

The embodiment will be described with reference to FIGS. 9 to 11. In this embodiment, the invention is applied to the formation of a bonded semiconductor wafer having a SOI structure for pattern formation. With this embodiment, it is possible, in wafer bonding, to greatly reduce the elongation and contraction of wafers and intrusion of voids and also prevent the elongation and contraction of wafer.

Figure 9:
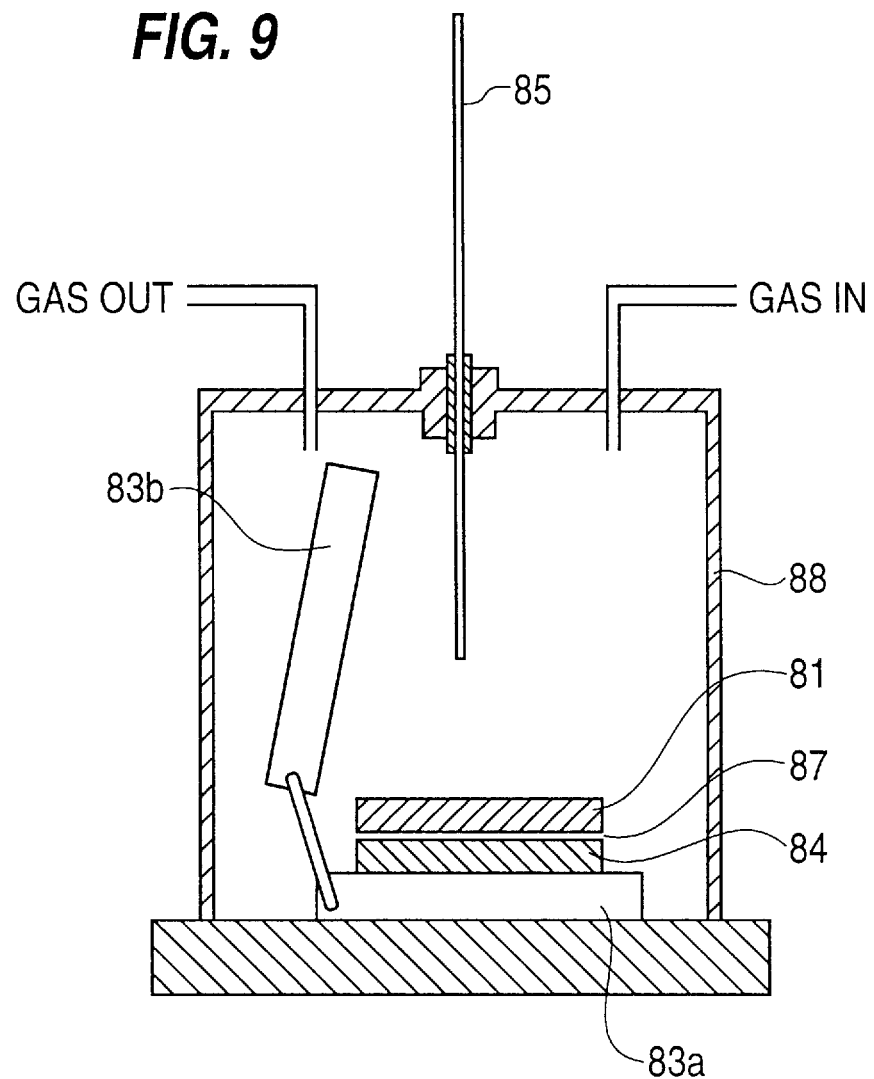
FIGS. 9 to 11 are views showing an embodiment of the invention.
Figure 10:
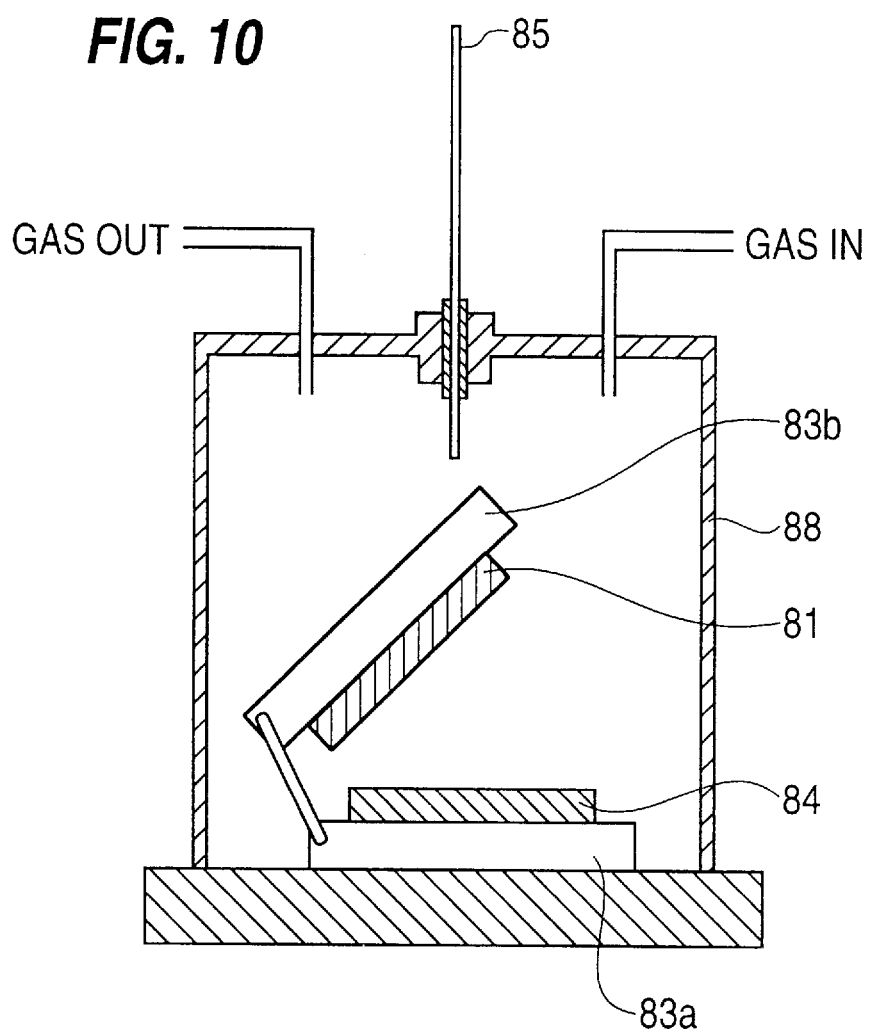

FIG. 10 shows a state before the wafer bonding in the embodiment. FIG. 9 shows a state before the start of sticking in the next start of bonding. FIG. 11 shows a state after bonding by sticking.

In the embodiment, as shown in FIG. 9, in the wafer bonding method, in which wafers 81 and 84 are bonded together to form a bonded wafer, the pressure or kind of gas between the two wafers 81 and 84 is selected for the bonding. Specifically, the pressure between the wafers 81 and 84 before the start of the sticking of the surfaces is set to be below the atmospheric pressure, particularly 0.2 to 0.5 atm., more particularly substantially 0.3 atm., and the space between the wafers before the start of the sticking of the surfaces is filled with a gas having a lower viscosity than air, particularly, hydrogen gas.

More specifically, in the embodiment, for making sufficient use of the hydrogen bond force between the two wafers 81 and 84 to be bonded together, the wafers have their surfaces preliminarily treated to be hydrophilic and are used in a state without any dust attached to them. The treatment for making the wafer surfaces hydrophilic may be carried out by (1) treating the wafers 81 and 84 with fluoric acid so that their surfaces become clean Si surfaces and immediately thereafter (2) treating the wafers with an ammonia-hydrogen peroxide blend solution. (It is possible to carry out the sole step (2)). It is thought that the treatment makes the wafer surfaces rich in OH and thus enhances the bond force.

As shown in FIG. 10, the wafer 81 (i.e., wafer B) which has been patterned and the wafer 84 (i.e., wafer A) to be bonded to the wafer 81 are secured to respective chucks A and B (83a and 83b) provided in a chamber 88. For the securement, it is possible to use vacuum chucks or electrostatic chucks.

Then, the pressure in the chamber 88 is reduced to about 0.1 atm.

Subsequently, hydrogen gas ($H_2$) is introduced into the chamber 88 until the inner pressure becomes 0.2 atm. Thus, hydrogen gas under 0.3 atm. is provided as the inner atmosphere in the chamber 88.

Then, the wafer 81 (i.e., wafer B) is moved with the wafer chuck 83b to a position to face the wafer 84 (i.e., wafer A). Thus, the space between the wafers 81 and 84 is filled with hydrogen gas under 0.3 atm.

Figure 1A:
FIGS. 1A to 1D are views illustrating a prior art method of wafer bonding.
Figure 1B:
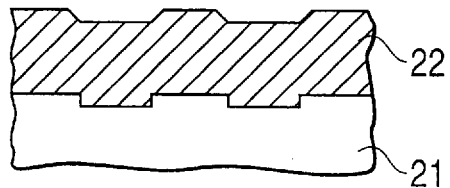
Figure 1C:
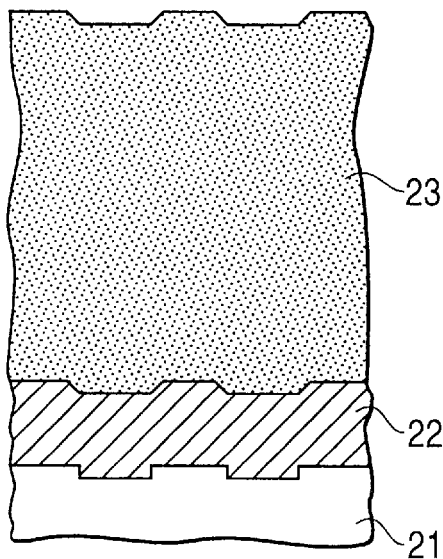
Figure 1D:
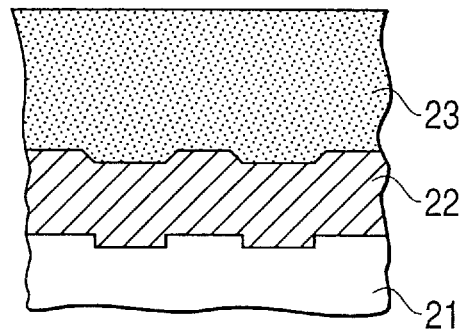
Figure 2A:
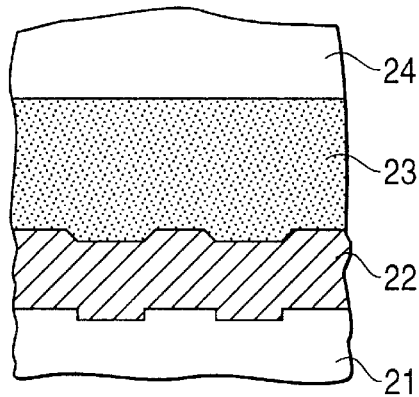
FIGS. 2A to 2C are views illustrating a prior art process of manufacture of a SOI semiconductor device.
Figure 2B:
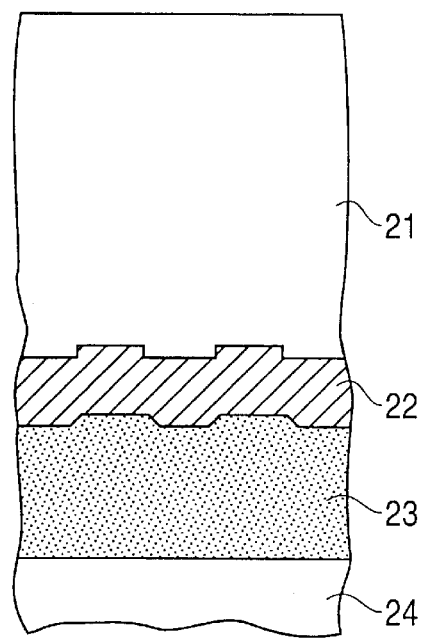
Figure 2C:
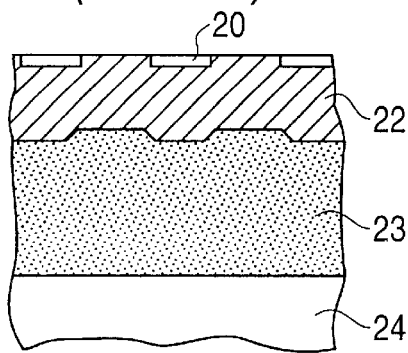
Figure 3A:
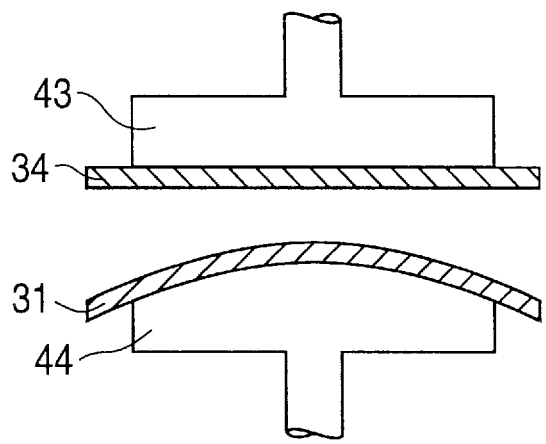
FIGS. 3A to 3C are views illustrating a prior art method of wafer bonding.
Figure 3B:
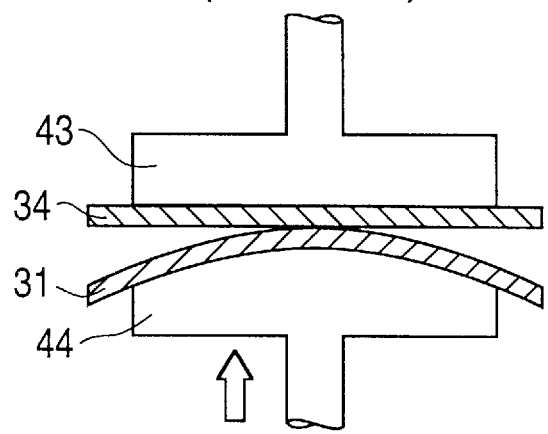
Figure 3C:
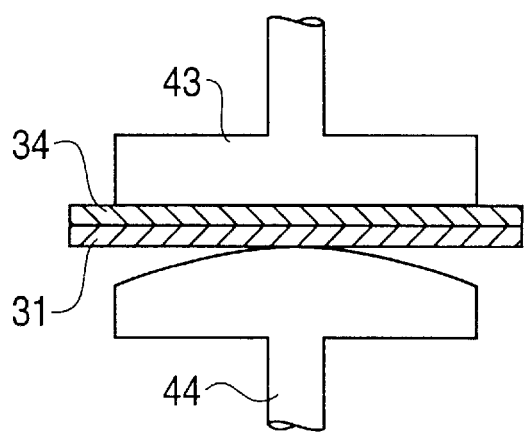
Figure 4A:
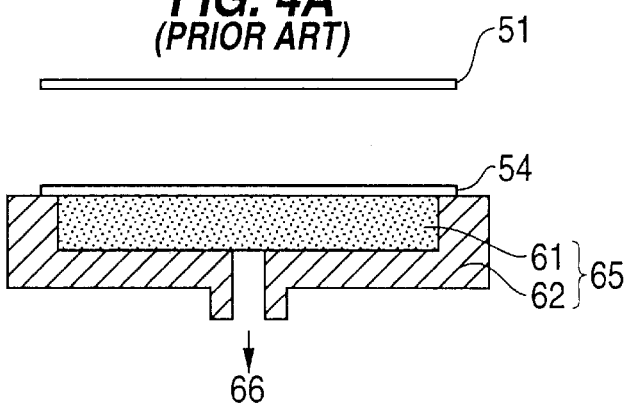
FIGS. 4A to 4D are views illustrating a prior art method of wafer bonding.
Figure 4B:
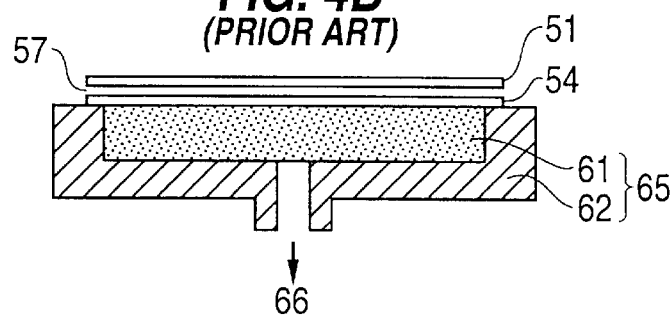
Figure 4C:
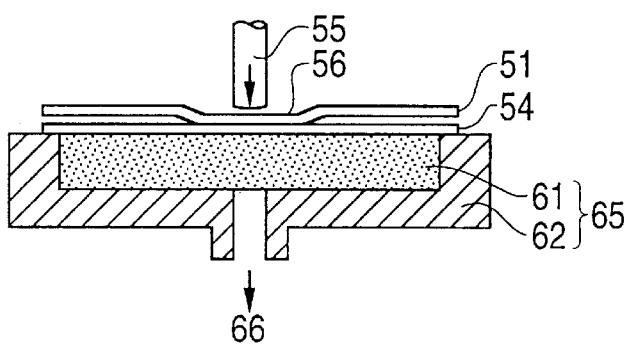
Figure 4D:
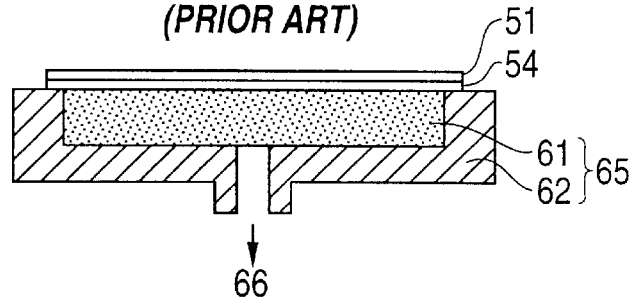
Figure 5A:
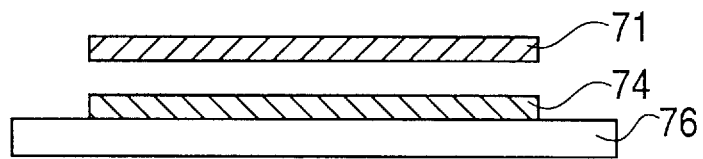
FIGS. 5A and 5B are views illustrating a prior art method of wafer bonding.
Figure 5B:
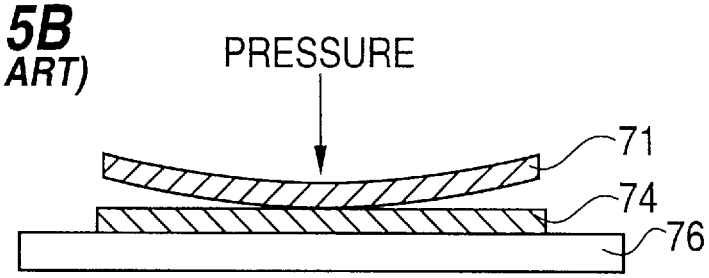
Figure 6:
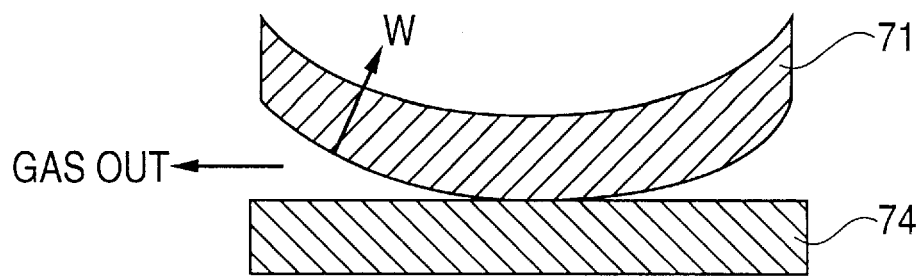
FIG. 6 is a view illustrating wafer bonding for explaining problems inherent in the related art.
Figure 8:
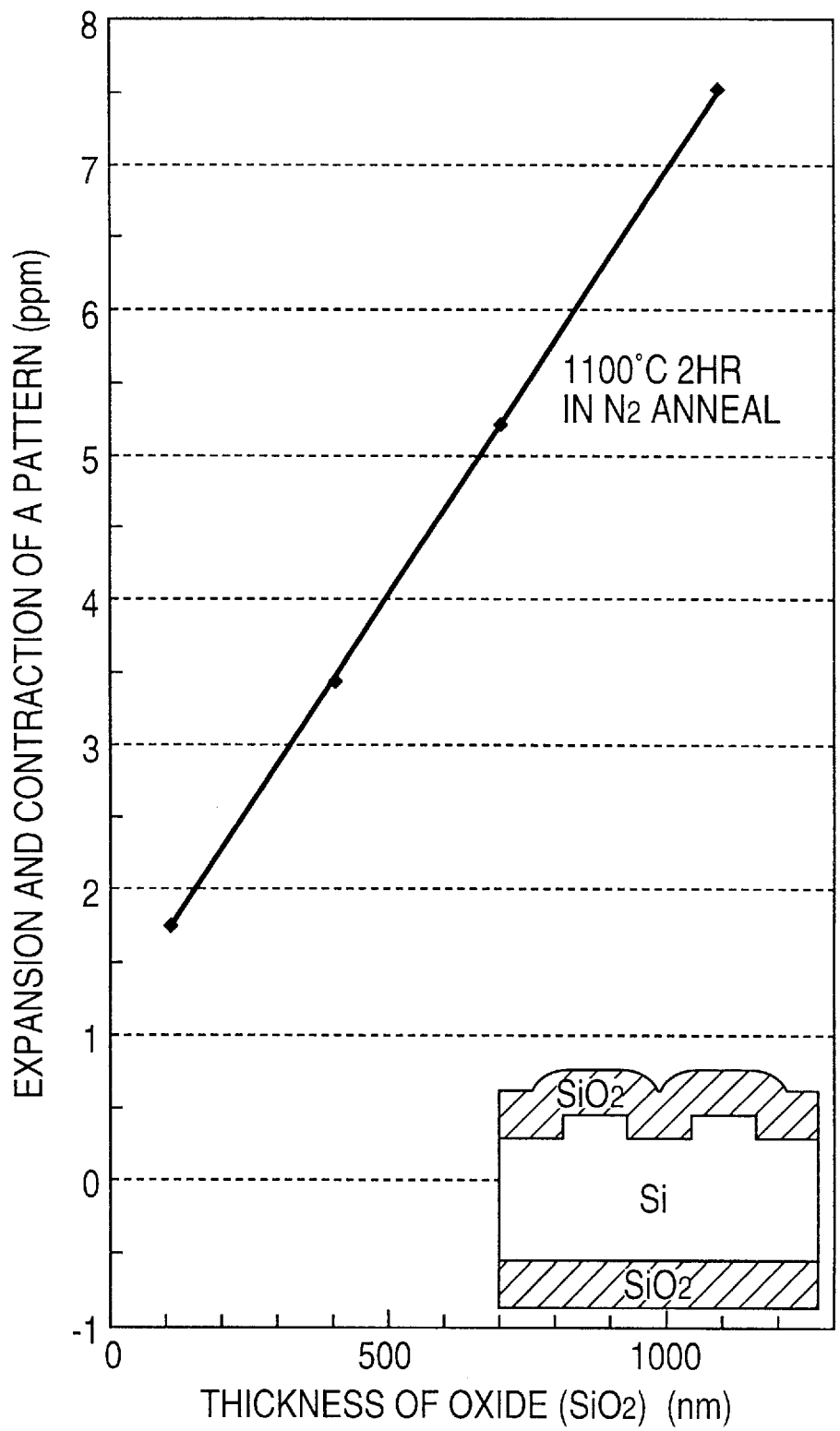
FIG. 8 is a view showing elongation and contraction of wafer wafer for explaining related art problems.

Then, the chuck 83b is released from the wafer 81 (i.e., wafer B) (FIG. 8), and then the chuck 83b is moved to a position free from being touched by a pressure application bar.

Figure 11:
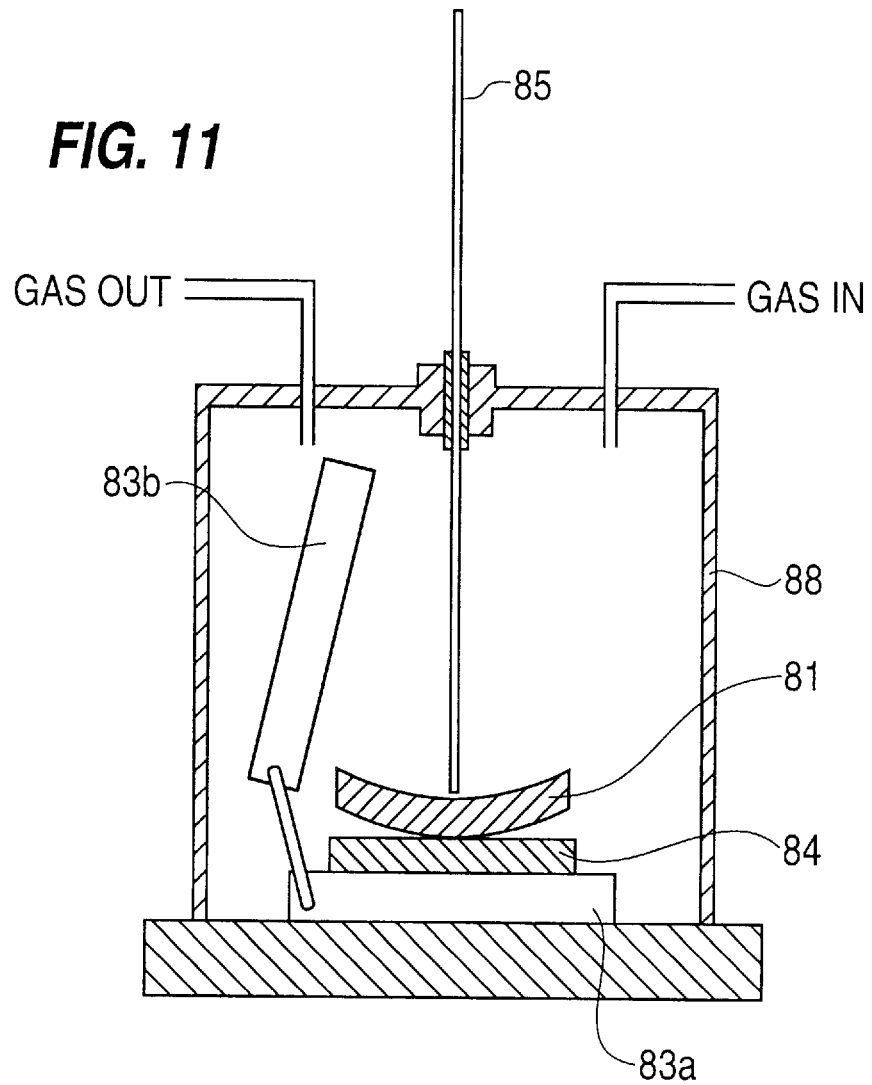

Then, the pressure application bar 85 is brought into contact with the wafer 81 (i.e., wafer B), and pressure is applied thereto (FIG. 11).

In the instant embodiment, as the pressure application bar 85 is used a push bar with a contact area of 1 to 10 mm in diameter (satisfactory results being obtained by using a push bar 5 mm in diameter), and a point of the wafer 81 near the center or the edge is pressed with a load of 0.5 to 5N (satisfactory results being obtained with 2N). As a result, the bonding is started with hydrogen bond forces.

Subsequently, the wafers 81 and 84 are left until the wafer 81 entirely sticks itself in the natural state to the flat wafer 84 (i.e., for 3 to 10 seconds with 5 inch diameter wafers).

According to this embodiment, the sticking proceeds along the flat wafer 84. In addition, since the-pressure and kind of gas between the wafers 81 and 84 are controlled, the bonding can be attained without elongation or contraction of the wafers and also introduction of voids.

In this embodiment, a predetermined kind and pressure of gas are set in the chamber 88 by a gas supply system and an evacuating system. The minimum necessary pressure is a pressure, under which the mutual sticking of the wafers does not commence but the two wafers are held floated with respect to each other. Control is done with respect to water characteristics (such as oxide layer thickness) under a pressure above such minimum necessary pressure.

In this embodiment, it is possible to reduce the elongation and contraction of pattern after the bonding to permit high accuracy overlapping before and after the bonding in the photo-lithographic process. Thus, it is possible to produce finer and greater integration density integrated circuits. Further, since the elongation and contraction of the wafer can be reduced, the contained stress can be reduced, which is desired for enhancing the performance and reliability of device.

The embodiment is applicable not only to the bonding of Si wafers but also to the bonding of Si and quarts wafers or wafers of other materials.

According to the invention, it is possible to attain wafer bonding with less elongation and contraction at the time of and after the bonding of wafers.

What is claimed is:

1. A method of wafer bonding for forming a bonded wafer by bonding together wafers with sticking forces of surfaces of said wafers, said method being carried out in cooperation with an apparatus having a chamber with a gas inlet and a gas outlet, a first chuck for holding a first wafer, a second chuck for holding a second wafer and moving said second wafer to said first wafer, said chamber including a pressure application bar for contacting at least one of said first and said second wafers, the method including the steps of:

setting a pressure of gas between said first and said second wafers before starting a sticking of said wafers to be below atmospheric pressure;

filling a space between said first and said second wafers before the start of sticking of surfaces of said wafers with a gas having a lower viscosity than air;

moving said second wafer to face said first wafer and releasing said second wafer from said second chuck, and applying pressure on said second wafer by said pressure application bar.

2. The method of wafer bonding according to claim 1, wherein the pressure of gas between said wafers is 0.2 to 0.5 atm. before starting a sticking of the surfaces.

3. The method as set forth in claim 1, wherein said gas pressure in said chamber between said wafers before the start of sticking is in range of about 0.2 to about 0.5 atm.

4. The method as set forth in claim 3, wherein said gas pressure is about 0.3 atm.

5. The method as set forth in claim 1, wherein said gas having a lower viscosity than air is hydrogen.

6. The method as set forth in claim 1, further including preliminary steps of preliminarily treating surfaces of said wafers to be rich in OH to enhance a bond force between them.

7. The method as set forth in claim 1, wherein the pressure applied by the pressure application bar is applied with a push bar having a contact area of about 1 to about 10 mm in diameter at a pressure of about 0.5 to 5N.

8. The method as set forth in claim 7, wherein said contact area is about 5 mm and said pressure is about 2N.

9. The method as set forth in claim 7, wherein said pressure is about 2N.

10. A method of wafer bonding for forming a bonded wafer by bonding together wafers with sticking forces of surfaces of said wafers, said method being carried out in cooperation with an apparatus having a chamber with a gas inlet and a gas outlet, a first chuck for holding a first wafer, a second chuck for holding a second wafer and moving said second wafer to said first wafer, said chamber including a pressure application bar for contacting at least one of said first and said second wafers, the method including the steps of:

filling a space between said first and said second wafers before starting a sticking of surfaces of said wafers with a gas having a lower viscosity than air;

moving said second wafer to face said first wafer and releasing said second wafer from said second chuck, and applying pressure on said second wafer by said pressure application bar.

11. The method of wafer bonding according to claim 10, wherein the pressure of gas between said wafers before the start of the sticking of the surfaces is lower than atmospheric pressure.

12. A method of wafer bonding for forming a bonded wafer by bonding together at least a pair of wafers with sticking forces of surfaces of said wafers, said method being carried out in cooperation with an apparatus having a chamber with a means for inputting a selected gas into said chamber and a means for exhausting a gas from said chamber to thereby establish a preterminated gas atmospere and gas pressure within said chamber, a first holding means for holding a first wafer, a second holding means for releasably holding a second wafer and capable of positioning said second wafer to said first wafer for bonding, said chamber including a means for pressure contacting at least one of said first and said second wafers, the method including the steps of:

setting a gas pressure between said first and said second wafers before starting a sticking of said wafers to be below atmospheric pressure;

filling a space between said first and said second wafers before the start of sticking of surfaces of said wafers with a gas having a lower viscosity than air;

positioning said second wafer to face said first wafer and releasing said second wafer from said second wafer holding means, and applying pressure on said second wafer by said pressure contacting means with a push bar having a contact area of about 1 to about 10 mm in diameter at a pressure of about 0.5 to 5N.

13. The method as set forth in claim 12, wherein said pressure in said chamber between said wafers before the start of sticking is in range of about 0.2 to about 0.5 atm.

14. The method as set forth in claim 13, wherein said pressures is about 0.3 atm.

15. The method as set forth in claim 12, wherein said gas having a lower viscosity than air is hydrogen.

16. The method as set forth in claim 12, further including the preliminary steps of preliminarily treating surfaces of said wafers to be rich in OH to enhance a bond force between them.

17. The method as set forth in claim 16, wherein the step of preliminarily treating said surfaces includes a step of treating said surfaces with an ammonia-hydrogen peroxide blend solution.

18. The method as set forth in claim 17, wherein the step of preliminarily treating said surfaces further includes a step of treating said surfaces with fluoric acid.

19. The method as set forth in claim 12 wherein said contact area is about 5 mm and said pressure is about 2N.

20. The method as set forth in claim 12, wherein said contact pressure is about 2N.

* * * * *